(12) United States Patent
Schuck et al.

(10) Patent No.: US 10,968,099 B2
(45) Date of Patent: Apr. 6, 2021

(54) PACKAGE MOISTURE CONTROL AND LEAK MITIGATION FOR HIGH VACUUM SEALED DEVICES

(71) Applicant: Texas Instruments Incorporated, Dallas, TX (US)

(72) Inventors: Kathryn Anne Schuck, Dallas, TX (US); Kristofer Scott Oberascher, Princeton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/234,878

(22) Filed: Dec. 28, 2018

(65) Prior Publication Data
US 2020/0207614 A1 Jul. 2, 2020

(51) Int. Cl.
*B81C 1/00* (2006.01)
*B81B 7/00* (2006.01)

(52) U.S. Cl.
CPC ........ *B81C 1/00269* (2013.01); *B81B 7/0038* (2013.01); *B81C 2203/019* (2013.01); *B81C 2203/037* (2013.01)

(58) Field of Classification Search
CPC combination set(s) only.
See application file for complete search history.

(56) References Cited

U.S. PATENT DOCUMENTS

| 2006/0214288 | A1* | 9/2006 | Ohsumi | H01L 24/97 257/724 |
| 2011/0024923 | A1* | 2/2011 | Foster | B81C 1/00269 257/787 |
| 2013/0113103 | A1 | 5/2013 | West et al. | |
| 2013/0328141 | A1* | 12/2013 | Ararao | B81B 7/0032 257/415 |
| 2013/0330878 | A1 | 12/2013 | Ararao | |
| 2015/0014854 | A1* | 1/2015 | Gooch | H01L 23/49866 257/751 |
| 2017/0175283 | A1 | 6/2017 | Abbott et al. | |

* cited by examiner

*Primary Examiner* — Herve-Louis Y Assouman
(74) *Attorney, Agent, or Firm* — Michelle F. Murray; Charles A. Brill; Frank D. Cimino

(57) ABSTRACT

A device and method of forming the device that includes a first substrate having a cavity on a bottom surface of the first substrate and MEMS components formed on the first substrate and in the cavity; a second substrate having an upper surface; a first metal bond that extends around a perimeter of the cavity and forming a first connection between the bottom surface of first substrate and the upper surface of the second substrate; a second metal bond that extends around a perimeter of the first metal bond and spaced from the first metal bond, the second metal bond forming a second connection between the bottom surface of the first substrate and the upper surface of the second substrate; where the MEMS components are hermetically sealed between the first and second substrates. A getter agent can be between the first and second metal bonds.

23 Claims, 10 Drawing Sheets

PACKAGE MOISTURE CONTROL AND LEAK MITIGATION FOR HIGH VACUUM SEALED DEVICES

This matter relates to semiconductor devices and processes in general, and more specifically to the structure and fabrication of hermetically sealed microelectromechanical systems (MEMS) devices.

BACKGROUND

Products collectively called microelectromechanical systems (MEMS) devices are usually small, lightweight devices on the micrometer to millimeter scale, which may have mechanically moving parts and often movable electrical power supplies and controls, or they may have parts sensitive to thermal, acoustic, or optical energy. Because of their moving and sensitive nature, MEMS devices are physically and atmospherically protected. Consequently, MEMS devices are usually placed on or in a substrate and contained with a housing or package, which is configured to shield the MEMS components against ambient and electrical disturbances and conditions, and against stress; however, this is optional.

A microelectromechanical systems (MEMS) device integrates one or more mechanical elements, sensors, actuators, or the like together with associated electronics on a common substrate. The manufacturing approach for a MEMS device aims at using batch fabrication techniques similar to those used for other microelectronics devices. MEMS devices can thus benefit from mass production and minimized material consumption to reduce the manufacturing cost, while trying to exploit well controlled integrated circuit technology.

Examples of MEMS devices include mechanical sensors, pressure sensors including microphone membranes, and inertial sensors such as accelerometers coupled with the integrated electronic circuit of the chip. The mechanically moving parts of a MEMS device are fabricated together with the sensors and actuators in the process flow of the electronic integrated circuit (IC) on a semiconductor chip. The mechanically moving parts may be produced by an undercutting etch during the IC fabrication. Examples of specific bulk micromachining processes employed in MEMS sensor production to create the movable elements and the cavities for their movements are anisotropic wet etching and deep reactive ion etching.

Another example is a digital infrared (IR) temperature sensor made in a silicon chip, which includes a thermopile (multiple thermocouple elements) of bismuth/antimony or constantan/copper pairs on a sensor membrane suspended in a cavity created by anisotropic silicon wet etching through a grid of holes. The cavity is closed by laminating another membrane over the membrane to protect the sensors.

One of the problems associated with the formation of these MEMS devices is that during the temperature ramp to bond together two substrates, water and other material that was adsorbed on the substrate surfaces is released, thereby interfering with the sealing target pressure for the MEMS device. Accordingly, for high vacuum MEMs devices, such additional pressure that results from the release of water and other material can cause premature failure.

For some wafer-level packaging applications, a heating step may be performed before bonding to drive the adsorbed water from the substrate surfaces. However, for applications with low temperature bond metallurgies (e.g., gold and indium), heating the wafer before forming the bond can result in premature intermetallic formation, thereby interfering with or preventing hermetic sealing by the bond lines.

SUMMARY

The described examples address the internal environment pressure of electronics sealed through hermetic bonds. During the temperature ramp to bond together two substrates, water adsorbed on the substrate surfaces is released into the formed device (e.g., MEMS device, etc.), thereby inhibiting or preventing the device to being sealed at a target pressure. Failure to seal the device at the target pressure, such as for high vacuum devices, can result in immediate or premature failure of the device. The described examples provide for improved pressure control in bonding substrates in a high vacuum environment. The described examples also or alternatively provide for improved pressure control in bonding substrates in a high vacuum environment where a pre-bond bake risks bond quality. The described examples also or alternatively prolong the life of the high vacuum environment located between the bonded substrates.

Described examples include a method for forming a device. The method includes forming a cavity in a first surface of a first substrate, and forming a MEMS component in the cavity, the first substrate including a first metal layer on or adjacent to a perimeter of the cavity, and a second metal layer adjacent to the first metal layer on the first surface. The method also includes, on a second substrate having opposite first and second surfaces, forming a third metal layer and a fourth metal layer on a surface of the second substrate, the fourth metal layer being spaced from and in alignment with the third metal layer. The method further includes placing the first and second substrates in a vacuum environment, and positioning the first and second substrates together so that the first metal layer on the first substrate contacts or is adjacent to the third metal layer (e.g., spaced by less than a distance that corresponds to the thickness of one of the first and third metal layers), and (B) the second metal layer on the first substrate contacts or is positioned closely adjacent to the fourth metal layer on the second substrate (e.g., spaced by less than a distance that corresponds to the thickness of one of the second and fourth metal layers). The method further includes hermetically sealing the MEMS component in the cavity by heating the first, second, third, and fourth metal layers to form a first metal bond between the first and third metal layers and to form a second metal bond to form between the second and third metal layers. The method optionally further comprises adding a getter agent between the first metal layer and the second metal layer on the first substrate or between the third and fourth metal layers on the second substrate. The heating optionally causes the getter agent to absorb and/or bond with water vapor and/or other gasses from the cavity. The first, second, third, and fourth metal layers optionally each include a metal selected from the group of gold, indium, tin, gallium, copper, germanium, silicon, silver, platinum, palladium, nickel, and aluminum. The getter agent optionally includes a material selected from the group of barium, aluminum, magnesium, calcium, sodium, strontium, cesium, phosphorus, zirconium, vanadium, cobalt, graphite, and zeolite. The thickness of the getter agent is optionally 2-100 µm. The thickness the metal bond formed between the first and third metal layers is optionally 0.1-500 µm, and a thickness the metal bond formed between the second and fourth metal layers is optionally 0.1-500 µm. A bond width for each of the first, second, third, and fourth metal layers is optionally 10-500 µm. For non-semiconductor devices, the bond width for each of the first, second, third, and fourth metal layers can be up to 5 cm, and generally 10 µm to 5 cm. The heating optionally causes the first, second, third, and fourth metal layers to heat to 150-600° C. The heating optionally causes activation of the getter agent.

Described examples include a device comprising: a first substrate including a cavity positioned on a bottom surface of the first substrate and one or more MEMS components formed on the first substrate and located in the cavity; a second substrate having an upper surface; first metal bond positioned around a perimeter of the cavity, the first metal bond forming a first connection between the bottom surface of first substrate and the upper surface of the second substrate; a second metal bond positioned around a perimeter of the first metal bond and spaced from the first metal bond, the second metal bond forming a second connection between the bottom surface of first substrate and the upper surface of the second substrate; and wherein the one or more MEMS components are hermetically sealed between the first and second substrates. The device optionally further comprises a getter agent (300,500) positioned between the first and second metal bonds. The first and second metal bonds optionally include one or more metals selected from the group of gold, indium, tin, gallium, copper, germanium, silicon, silver, platinum, palladium, nickel, and aluminum. The getter agent optionally includes one or more material selected from the group of barium, aluminum, magnesium, calcium, sodium, strontium, cesium, phosphorus, zirconium, vanadium, cobalt, graphite, and zeolite. The thickness of the getter agent is optionally 2-100 µm. The thickness the first metal bond is optionally 0.1-500 µm, and a thickness the second metal bond is optionally 0.1-500 µm. A bond width for each of the first metal layer and the second metal layer is optionally 10-500 µm.

DETAILED DESCRIPTION

Figure 1:
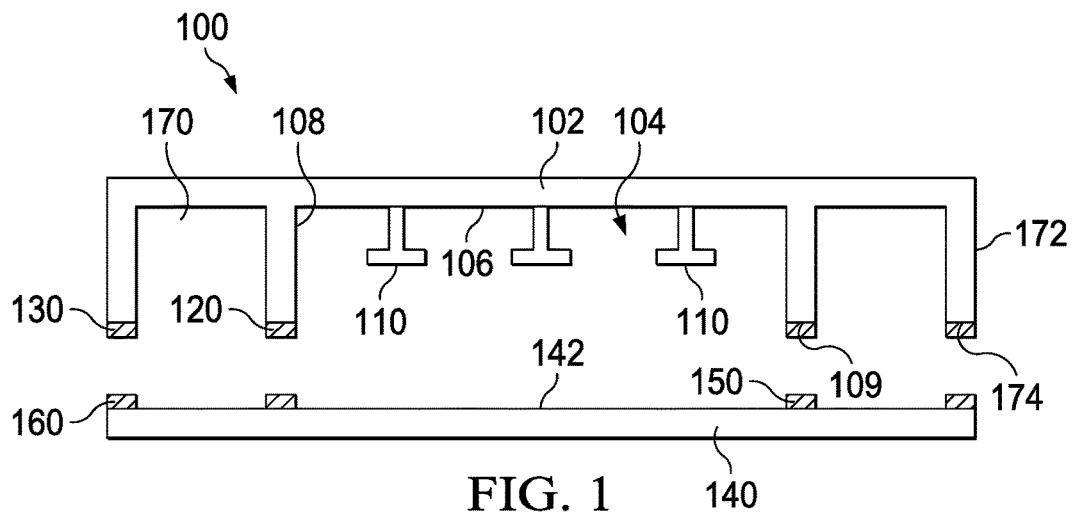
FIG. 1 is a partial cross-sectional view of a MEMS device before connecting together two substrates of a MEMS device.

In the drawings, like reference numerals refer to like elements throughout, and the various features are not necessarily drawn to scale. In this description, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

The various features of the disclosed examples can be used in connection with a variety of different devices such as semiconductor devices including integrated circuits having multiple electronic components, as well as single-component semiconductor devices (e.g., single transistor products, single diode products, etc.).

Figure 2:
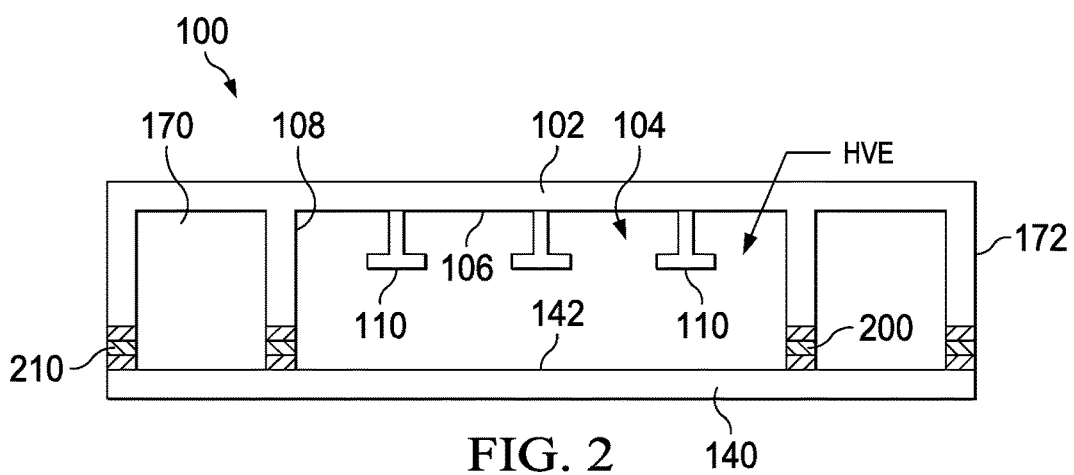
FIG. 2 is a partial cross-sectional view of the MEMS device of FIG. 1 after connecting together the two substrates of the MEMS device.

Referring now to FIGS. 1 and 2, there is illustrated an example of a MEMS device 100 before and after the bonding together of the first and second substrates 102, 140 that partially or fully form the MEMS device. The device is not limited to a MEMS device. The device can be some other type of electronic component that requires hematic sealing of a chamber. The composition of each of the substrates can be the same or different and generally includes or is fully formed of glass, metal, ceramic, silicon, silicon-germanium, or gallium arsenide; however, other or additional materials can be used.

The first substrate 102 is illustrated as including one or more components such as a MEMS component, that are located in the first cavity, which first cavity is located in the bottom surface 106 of the first substrate. The one or more components can be formed on the bottom surface of the first substrate or be attached or connected to the bottom surface of the first substrate. The first cavity 104 is bound by first cavity wall 108. Any type and number of components can be located in first cavity 104 in various implementations. As illustrated in FIG. 1, the one or more components 110 do not extend beyond the bottom of first cavity 104; however, this is optional. The MEMS device generally includes other associate circuit components (not shown) of an integrated circuit (IC). A secondary cavity 170 is located around the outer perimeter of first cavity 104 and between first cavity wall 108 and secondary wall 172. The first cavity 104 can be any suitable size, shape and depth. Likewise, the secondary cavity 170 can be any suitable size, shape and depth. The formation of cavity 104 and secondary cavity 170 can be by standard etching techniques or by other techniques. The depth of secondary cavity 170 can be the same or different from the depth of first cavity 104. In one example, the width of secondary cavity 170 is generally constant around the first cavity 104; however, this is optional. The first cavity wall 108 and/or the secondary wall 172 can optionally be sloped. In another example, the depth of secondary cavity 170 is the same as the depth of first cavity 104.

A first metal layer 120 is deposited on first cavity wall 108 and extends in one example around (i.e., extends completely around) the perimeter of the first cavity. The first metal layer can cover a portion or the complete bottom surface 109 of the cavity wall. The first metal layer can be formed of one or more layers of metal and the first metal layer can be formed of one or more metals. The first metal layer can be formed by mechanical depositing, chemical deposition, chemical vapor deposition, electroplating, atomic layer deposition, etc. Any suitable process can be used to deposit the first metal layer. The thickness of first metal layer is generally 0.1-500 µm (and all values and ranges therebetween), for example, about 1-20 µm. The width of the first metal layer is generally 10-500 µm (and all values and ranges therebetween), for example, about 100-300 µm. The metal used to form the first metal layer is or includes gold, indium, tin, gallium, copper, germanium, silicon, silver, platinum, palladium, nickel, and/or aluminum.

The second metal layer 130 is deposited on secondary wall 172 around the complete perimeter of first cavity wall 108. The second metal layer can cover a portion or the complete bottom surface 174 of the secondary cavity wall. The second metal layer can be formed of one or more layers of metal and the second metal layer can be formed of one or more metals. The second metal layer can be formed by mechanical depositing, chemical deposition, chemical vapor deposition, electroplating, atomic layer deposition, etc. Any suitable process can be used to deposit the second metal layer. The thickness of second metal layer is generally 0.1-500 µm (and all values and ranges therebetween), for example, about 1-20 µm. The width of the second metal layer is generally 10-500 µm (and all values and ranges therebetween), for example, about 100-300 µm. The metal used to form the second metal layer is or includes gold, indium, tin, gallium, copper, germanium, silicon, silver, platinum, palladium, nickel, and/or aluminum. The metal used to form the first and second metal layers can be the same or different. The thickness and/or width of the first and second metal layers can be the same or different. In one example arrangement, the composition, thickness and width of the first and second metal layers is the same.

The second substrate 140 is illustrated as being a generally uniform shaped substrate and is absent one or more components (e.g., MEMS components, etc.); however, it can be appreciated that the second substrate can have other shapes and include one or more components as illustrated in FIGS. 9-14, which are discussed in more detail below. The composition of the second substrate can be the same or different from the first substrate. For example, the first substrate can be a semiconductor substrate that is formed of a silicon material and the second substrate is a non-semiconductor substrate that can be formed of glass. In another example, both the first and second substrates are semiconductor substrates that are formed of a silicon material. In another example, both the first and second substrates are non-semiconductor substrate that are formed of a glass material. In another example, the first substrate is a semiconductor substrate that is formed of a silicon material and the second substrate is a non-semiconductor substrate that is formed of a metal or ceramic material.

The upper surface 142 of second substrate 140 includes a third metal layer 150 and a fourth metal layer 160. The positioning of third metal layer 150 on the second substrate 140 is selected so that when the first and second substrates are brought together for bonding, the first and third metal layers 120, 150 of the first and second substrates partially or fully overlie one another. Likewise, the positioning of fourth metal layer 160 on the second substrate 140 is selected so that when the first and second substrates are brought together for bonding, the second and fourth metal layers 130, 160 of the first and second substrates partially or fully overlie one another.

The third and fourth metal layers on the second substrate 140 can be formed of one or more layers of metal and the third and fourth metal layers can be formed of one or more metals. The third and fourth metal layers on the second substrate 140 can be formed by mechanical depositing, chemical deposition, chemical vapor deposition, electroplating, atomic layer deposition, etc. Any suitable process can be used to deposit the first and second metal layers. The thickness of first, second, third, and fourth metal layers is generally 0.1-500 µm (and all values and ranges therebetween), for example, about 1-20 µm. The width of the first, second, third, and fourth metal layers is generally 10-500 µm (and all values and ranges therebetween), for example, about 100-300 µm. The metal used to form the first, second, third, and fourth metal layers is or includes gold, indium, tin, gallium, copper, germanium, silicon, silver, platinum, palladium, nickel, and/or aluminum.

The metal used to form the first and third metal layers 120, 150 on the first and second substrates can have the same or different composition. In one example, the metal used to form the first and third metal layers 120, 150 on the first and second substrates is different. The metal used to form the second and fourth metal layers 130, 160 on the first and second substrates can have the same or different composition. In one example, the metal used to form the first and third metal layers 130, 160 on the first and second substrates is different.

Suitable metal compositions that can be used to form the first metal bond 200 and second metal bond 210 as illustrated in FIG. 2, such as gold and indium, gold and tin, copper and tin, gold and germanium, gold and silicon, aluminum and germanium, aluminum and silicon, etc. Accordingly, one of the first, second, third, and fourth metal layers can include one of the metals used to form the metal bond and the other metal layer includes the other metal used to form the gold-indium metal bond. In one example, the first and second metal layers on the first substrate can be formed of gold and the third and fourth metal layers on the second substrate can be formed of gold so that both the first and second metal bonds are formed of gold.

In another example, the first and second metal layers on the first substrate can be formed of gold and the third and fourth metal layers on the second substrate can be formed of indium so that the first and second metal bonds are formed of an alloy of gold and indium.

In another example, the first metal layer on the first substrate can be formed of gold and the third metal layer on the second substrate can be formed of gold, and the second metal layer on the first substrate can be formed of indium and the fourth metal layer on the second substrate can be formed of indium so that the first metal bond is formed of gold and the second metal bond is formed of indium.

In another example, the first and second metal layers on the first substrate can be formed of one or more layers of gold and one or more layers of indium and the third and fourth metal layers on the second substrate can be formed of one or more layers of gold and one or more layers of indium so that the first and second metal bonds are formed of an alloy of gold and indium.

The thickness and/or width of the first metal layers 120, 150 on the first and second substrates can be the same or different. The thickness and/or width of the second metal layers 130, 160 on the first and second substrates can be the same or different.

Figure 21:
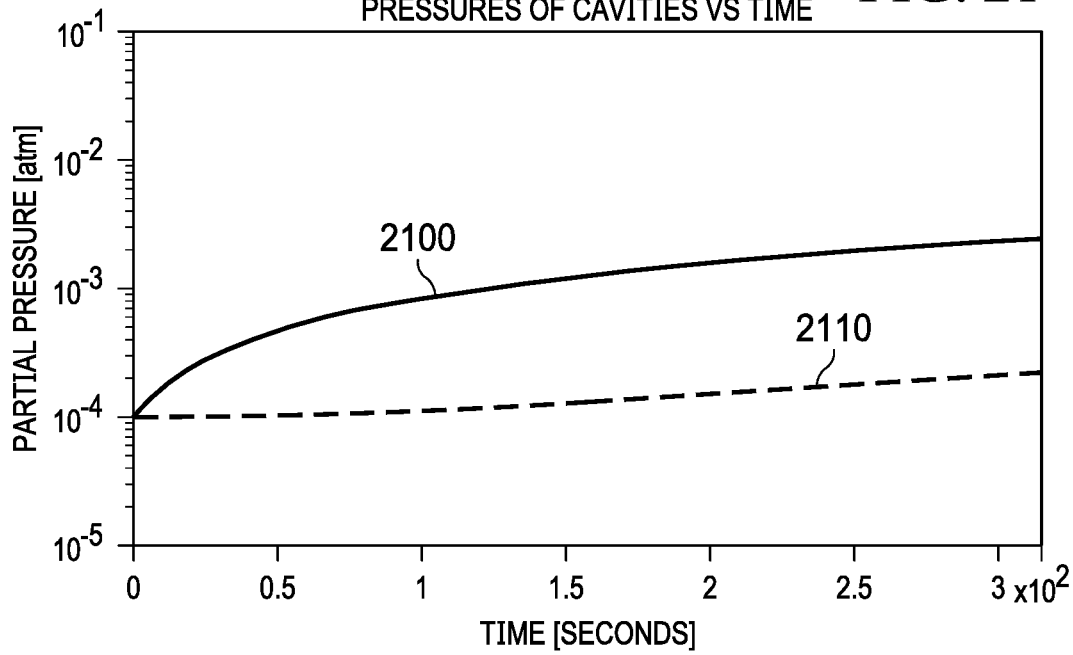
FIG. 21 is a graph illustrating the partial pressure over time in the high vacuum environment when a single metal bond is formed around the high vacuum environment.
Figure 22:
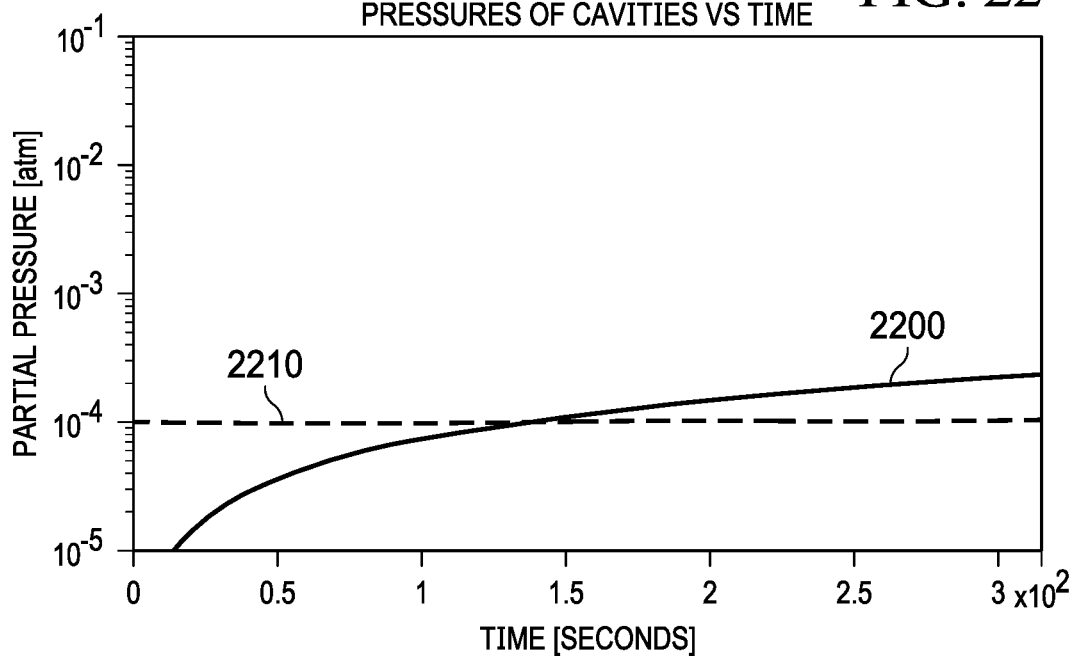
FIG. 22 is a graph illustrating the partial pressure over time in the high vacuum environment when two metal bonds are formed around the high vacuum environment and a getter agent is located in a region between the two metal bonds.

During the fabrication of the MEMS device, the environment about the one or more components 110 is generally held at a controlled target pressure that is below atmospheric pressure (i.e., 1 atm.). As illustrated in FIGS. 21 and 22, the target pressure can be less than 0.0001 atm.; however, other low pressures below 1 atm. can be used. The pressure in the controlled pressure environment can be below the target pressure that is desired in the sealed region that contains the one or more components 100; however, this is optional. Using a pressure in the controlled pressure environment can be below the target pressure can be used to compensate for any increase in pressure during the formation of the bond between the first and second substrates due to outgas.

Figure 19:
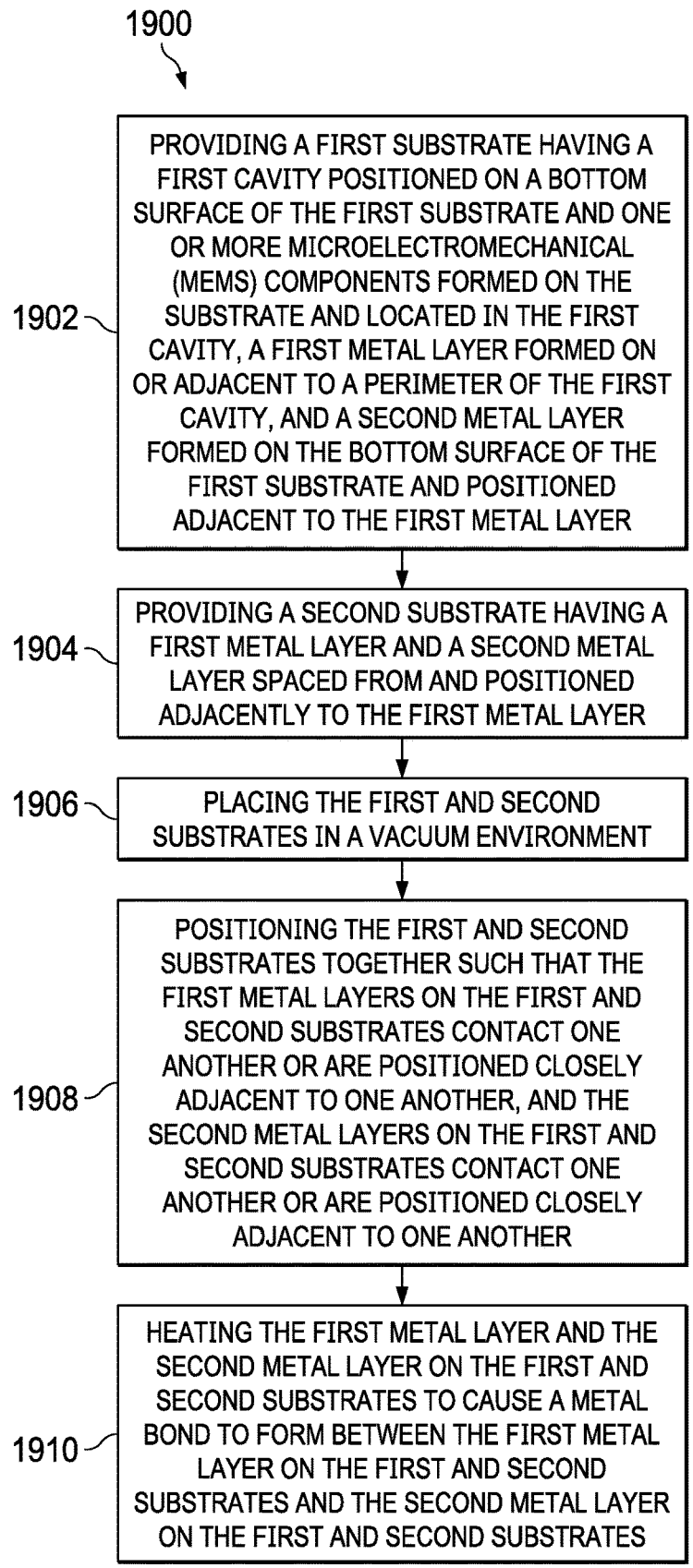
FIG. 19 is a flow diagram of one method for forming a MEMS device.

FIG. 19 shows an example method 1900 for forming a MEMS device. When the first and second substrates are connected together as illustrated in FIG. 2, first and second substrates are provided (e.g., at 1902, 1904 of FIG. 19) and are positioned together while in the controlled low pressure environment so that the first metal layers 120, 150 of the first and second substrates partially or fully overlie one another, and the second metal layers 130, 160 of the first and second substrates partially or fully overlie one another (e.g., at 1906, 1908 of FIG. 19). The first and second substrates are then subjected to heat so that the first, second, third, and fourth metal layers are heated to form a first metal bond between the first and third metal layers and to form a second metal bond between the second and fourth metal layers of the respective first and second substrates (e.g., at 1910 of FIG. 19). The heating temperature in one example is generally no more than about 600° C., such as 150-600° C. (and all values and ranges therebetween), and about 150-300° C. in one example. Other temperatures can be used depending on the composition of the metal layers, substrates and/or components. The metal bonds can be formed at the same time or at different times depending on the composition of the metal layers. In one example, metal bonds 200 and 210 are formed at generally the same time. Once the first metal bond 200 and the second metal bond 210 are formed, the components 110 are hermetically sealed in the first cavity 104 to create a high vacuum environment (HVE) for the MEMS components.

Figure 17:
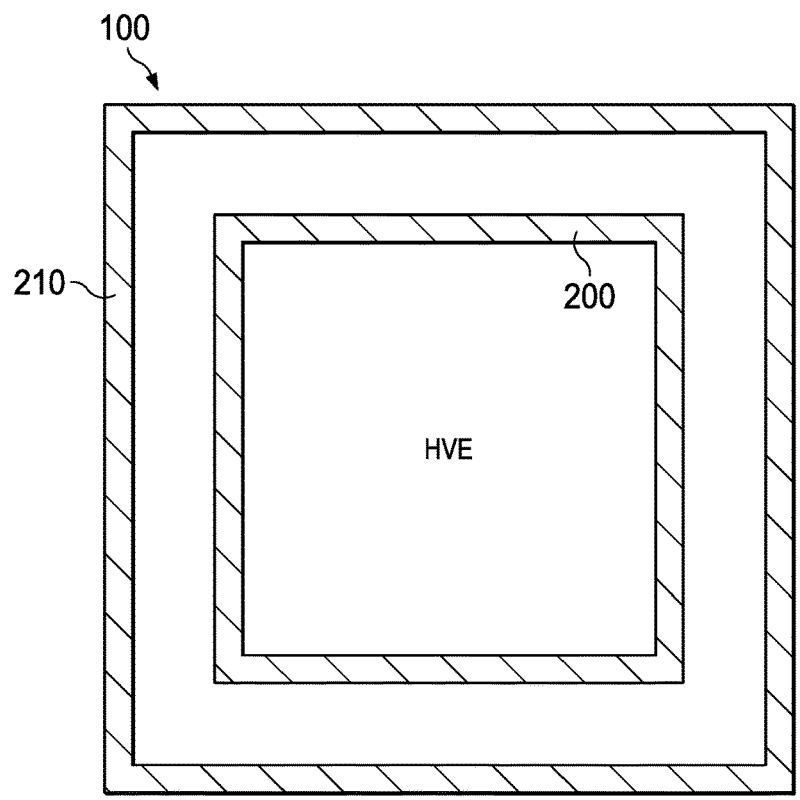
FIG. 17 is a partial cross-sectional view along the plane between the metal bond between the two substrates of a MEMS device.

FIG. 17 illustrates the formation of the first metal bond 200 and the second metal bond 210 about the HVE. The first metal bond 200 fully encircles the HVE and forms a seal about the HVE. Second metal bond 210 fully encircles first metal bond 200 and forms a seal about the first metal bond and the HVE. Accordingly, two metal bond seals are formed about (i.e., extending all the way around) the HVE to create a hermetic seal between the HVE and the external environment. The first and second metal bonds in one example inhibit or prevent gas from entering into and/or being released from the HVE. Accordingly, the first and second metal bonds can be used to prolong the life of the MEMS device. In another example, more than two metal bonds can be formed about the HVE to further improve the sealing of the HVE. If more than two bonds are formed, a getter agent can be included between all or some of the metal bonds. In another example, a getter agent can be positioned outside the outermost metal bond that encircles the HVE.

Figure 3:
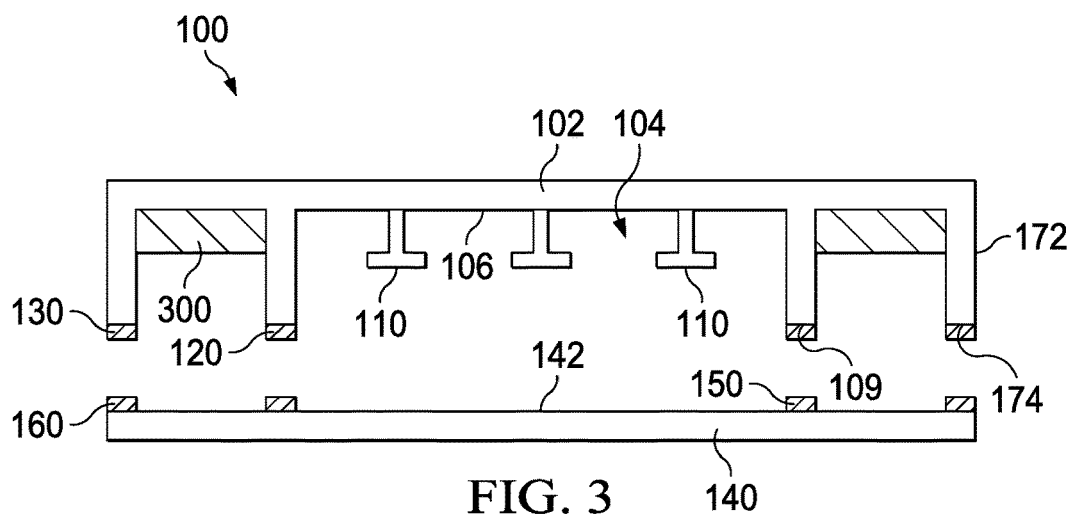
FIG. 3 is a partial cross-sectional view of another MEMS device before connecting together two substrates of the MEMS device.
Figure 4:
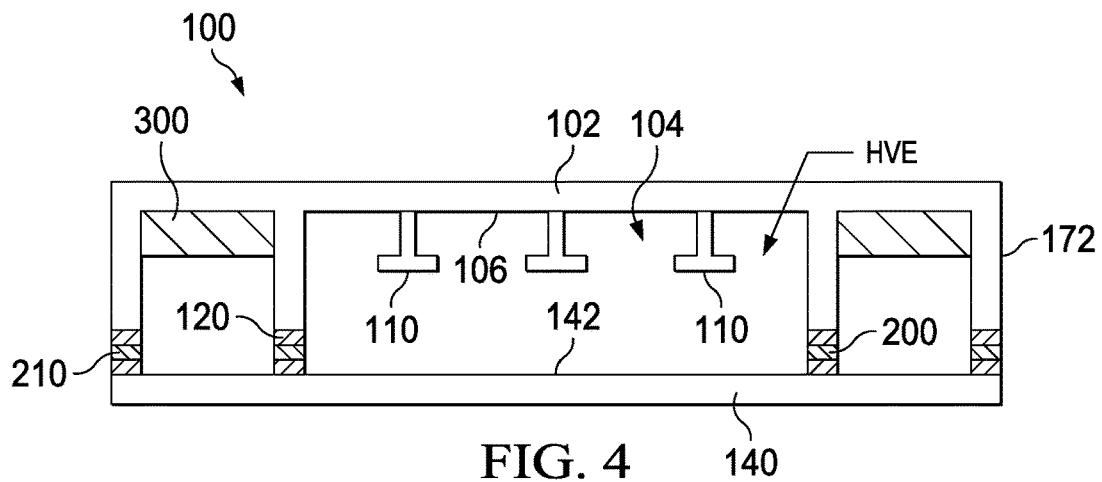
FIG. 4 is a partial cross-sectional view of the MEMS device of FIG. 3 after connecting together the two substrates of the MEMS device.

FIGS. 3 and 4 respectively show another example of a MEMS device 100 before and after the bonding together of the first and second substrates 102, 140 that partially or fully form the MEMS device. The first and second substrates have similar components, compositions and structures to the first and second substrates illustrated in FIGS. 1 and 2 and as previously described, thus the same reference numbers are used to identify the components of the MEMS device of FIGS. 3 and 4. The difference between the MEMS device of FIGS. 1 and 2 and the MEMS device of FIGS. 3 and 4 is the use of a getter agent 300 that is located in secondary cavity 170 of first substrate 102. Although not shown, a getter agent can be positioned outside the secondary cavity and adjacent to secondary wall 172.

The getter agent is formulated to absorb and/or otherwise bond with water vapor and or materials that are released from the first and/or semiconductor substrate during the heating of one or more portions of the first and semiconductor substrate to form metal bonds 200, 210. The getter agent can be deposited in the secondary cavity by any number of processes (e.g., printed, deposited, chemically deposited, sputter, electroplated, cbd, etc.). The getter agent can be deposited as a single layer or multiple layers. The thickness of the getter agent in one example is generally at least 1 μm and can be up to several hundred μm. The amount of getter agent deposited in the secondary cavity in one example depends on the effectiveness and performance of the getter agent and the amount of outgassing expected during the formation of metal bonds 200, 2100. A single type or multiple types of getter agents can be deposited in the secondary cavity.

In one example, the getter agent includes barium, aluminum, magnesium, calcium, sodium, strontium, cesium, phosphorus, zirconium, vanadium, cobalt, graphite, titanium oxide, and/or zeolite. Suitable examples of flashed getter agents include barium, aluminum, magnesium, calcium, sodium, strontium, cesium and phosphorus. Suitable examples of solid getter agents include zirconium-vanadium, zirconium-cobalt, zirconium-aluminum, zirconium-graphite and zeolite. The getter agent can be deposited partially or fully about first cavity 104. The thickness of the getter agent about first cavity 104 can be constant or can vary. The composition of the getter agent about first cavity 104 can be the same or different.

In one example, the getter agent fully encircles first cavity 104, the composition of the getter agent about the cavity is uniform, and the thickness of the getter agent is constant about the cavity. As illustrated in FIGS. 3 and 4, the thickness of the getter agent in one example is less than the depth of the secondary cavity 170. In another example, the thickness of the getter agent is the same as the depth of the secondary cavity to completely fill the secondary cavity. The getter agent in one example absorbs, binds and/or otherwise removes outgas or other gasses in the HVE region during the formation of first metal bond 200 and second metal bond 210, and thereafter. Accordingly, the first and second metal bonds in conjunction with the getter agent can be used to maintain the target pressure in the HVE during the formation of first metal bond 200 and second metal bond 210, and to prolong the life of the MEMS device.

Figure 20:
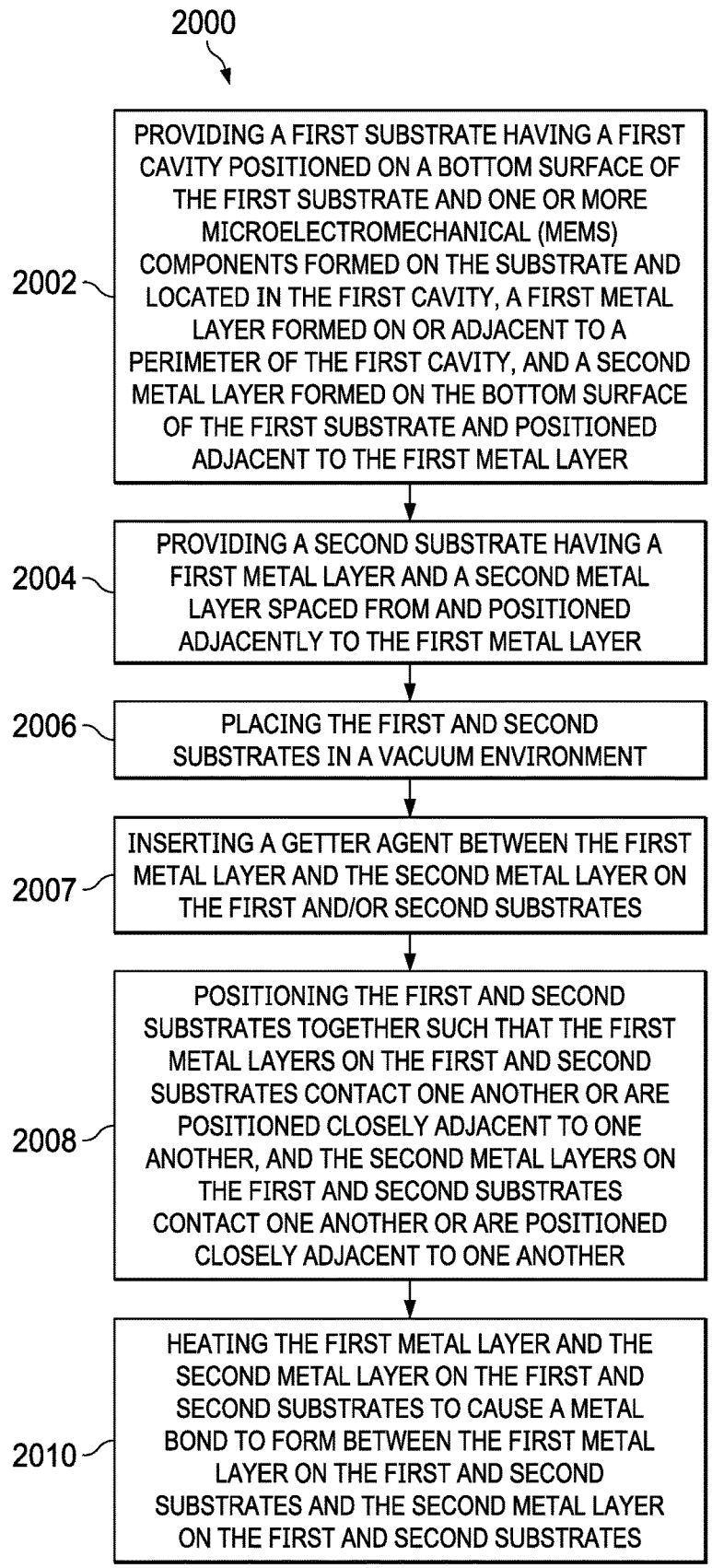
FIG. 20 is a flow diagram of another method for forming a MEMS device.

FIG. 20 shows an example method 1800 for forming a MEMS device. When the first and second substrates are connected together as illustrated in FIG. 4, first and second substrates are provided (e.g., at 2002, 2004 of FIG. 20) and placed in a controlled low pressure environment (e.g., at 2006 of FIG. 20). A getter agent is deposited in the secondary cavity 170 (e.g., at 2007 of FIG. 20). The getter agent in one example is deposited in the secondary cavity of one or both of the first and second substrates in the low pressure environment. The first and second substrates are positioned together in the low pressure environment so that the first and third metal layers 120, 150 of the respective first and second substrates partially or fully overlie one another, and the second and fourth metal layers 130, 160 of the respective first and second substrates partially or fully overlie one another (e.g., at 2008 of FIG. 20). The first and second substrates are then subjected to heat so that the first and second metal layers are heated to cause a metal bond to form between the first and third metal layers and between the second and fourth metal layers of the first and second substrates (e.g., at 2010 of FIG. 20). The heating temperature is generally no more than about 600° C., typically 150-600° C. (and all values and ranges therebetween), and more typically 150-300° C. Other temperatures can be used depending on the composition of the metal layers, semiconductor substrates and/or MEMS components. The getter agent partially or fully removes outgas formed during and after the formation of the metal bonds so as to maintain a target pressure in the region about the HVE. Once first metal bond 200 and second metal bond 210 are formed, the components 110 are hermetically sealed in first cavity 104 to create the HVE for the components 110.

The getter agent is generally activated by the heat used to form first metal bond 200 and second metal bond 210. In another example, the getter agent is activated by other or additional means (e.g., certain electromagnetic waves, ultrasonic waves, etc.).

Figure 18:
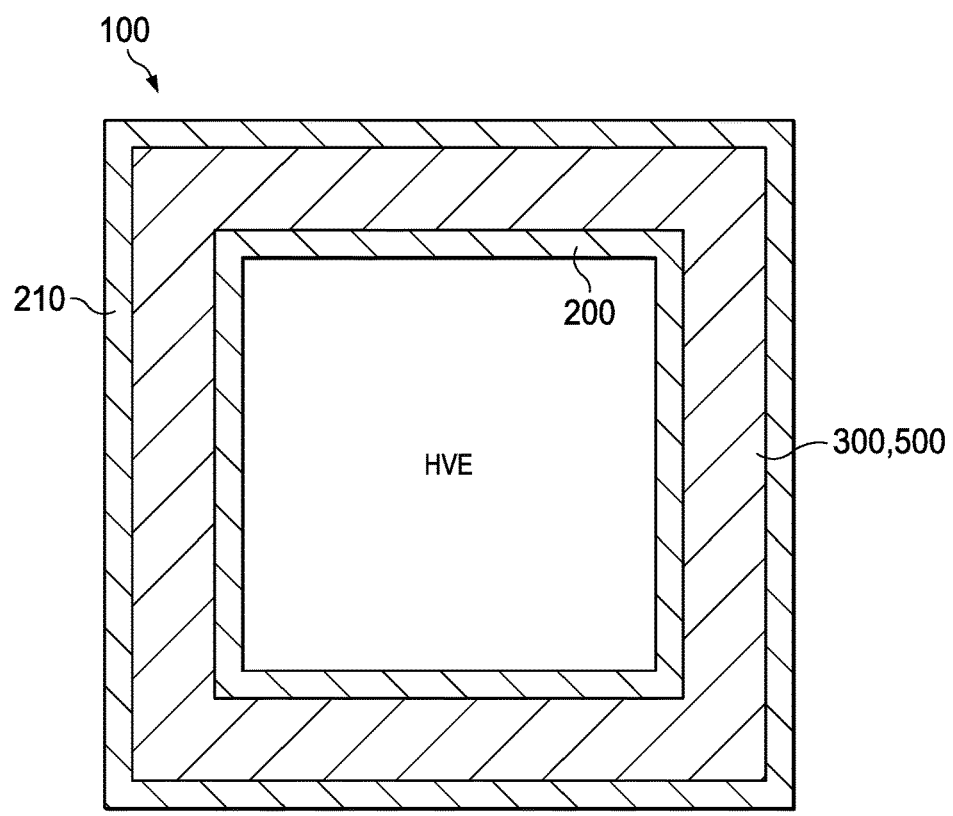
FIG. 18 is a partial cross-sectional view along the plane between the metal bond between the two s substrates of a MEMS device.

FIG. 18 illustrates the formation of first metal bond 200 and second metal bond 210 about the HVE. First metal bond 200 fully encircles the HVE and forms a seal about the HVE. Second metal bond 210 fully encircles first metal bond 200 and forms a seal about the first metal bond and the HVE. Accordingly, two metal bond seals are formed about the HVE to create a hermetic seal between the HVE and the external environment. Getter agent 300, 500 is illustrated as located between first metal bond 200 and second metal bond 210. The getter agent is used during the formation of metal bonds 200, 210 to remove gases released from the semiconductor substrates to maintain a target pressure about the region of the HVE until the formation of metal bonds 200, 210. Thereafter, the first and second metal bonds facilitate in inhibiting or preventing gas from entering into and/or being released from the HVE. As can be appreciated, more than two metal bonds can be formed about the HVE to further improve the sealing of the HVE.

FIGS. 21 and 22 illustrate the pressure changes over time in first cavity 104 and secondary cavity 170 after the formation of metal bonds 200, 210. FIG. 21 illustrates the pressure changes over time (0-10 years) in first cavity 104 and secondary cavity 170 after the formation of metal bonds 200, 210 when the secondary cavity is absent a getter agent. FIG. 22 illustrates the pressure changes over time (0-10 year) in first cavity 104 and secondary cavity 170 after the formation of metal bonds 200, 210 when the secondary cavity includes a getter agent. The x-axis is represented in second to times $10^8$. Accordingly, the end of the graph represents about 10 years. The y-axis is presented in atmospheres. The target pressure for the first cavity is $1\times10^4$ atm.; however, it can be appreciated that other target pressures can be used. As illustrated in FIG. 21, after the initial formation of the metal bonds 200, 210, the pressure in the first cavity and secondary cavity are at or near the target low pressure. However, over time after the metal bonds are formed, outgassing from the first and second substrates in the region about the secondary cavity and the first cavity continues, thus the pressure begins to increase. In addition, leaking bondlines can be an additional source of gasses entering the package from the environment. Pressure curve 2100 illustrates the pressure in the secondary cavity and pressure curve 2110 illustrates the pressure in the first cavity. After the formation of the metal bonds 200, 210, the two metal bonds result in the final pressure in the cavity to be close to the target pressure. Over time, the pressure in the secondary cavity is illustrated as slowly increasing, but the pressure in the first cavity only slightly increases over time. As illustrated in FIG. 21, the pressure increase in the first cavity after about 10 years is less than about 0.002 atm. Such a small pressure increase over extended periods of time (e.g., 10+ years) results increased life of the device.

FIG. 22 illustrates a further improvement in maintaining the final pressure in the first cavity at or very close to the target pressure. Pressure curve 2200 illustrates that the pressure in the secondary cavity is very low after the formation of the metal bonds due to the getter agent removing and/or absorbing gas in the region of the secondary cavity. As outgas is formed about the region of the first cavity and secondary cavity, the getter agent continues to remove and/or absorb gas in the region of the secondary cavity thereby reducing the amount of pressure increase in the secondary cavity and in the first cavity after metal bonds 200, 210 are formed. As illustrated by pressure curve 2210, there is very little, if any, pressure change in the first cavity after the formation of the metal bonds over a 10 year period.

For low temperature bond metallurgies, FIGS. 21 and 22 illustrate that the use of a getter agent in a region outside the HVE aids in controlling the pressure inside the HVE by trapping, absorbing, etc. water vapor and other gasses as they are released after the formation of metal bonds 200, 210. The getter agent also prevents the water vapor and other gasses that have been trapped, absorbed, etc. by the getter agent from being absorbed back into the first and second substrates as the temperature decrease after the metal bond formation. The secondary cavity that contains getter agent is believed to serve as an artificially large volume, which prolongs the life of the HVE by protecting the HVE from slow leaks and gas diffusion through the metal bonds.

Figure 5:
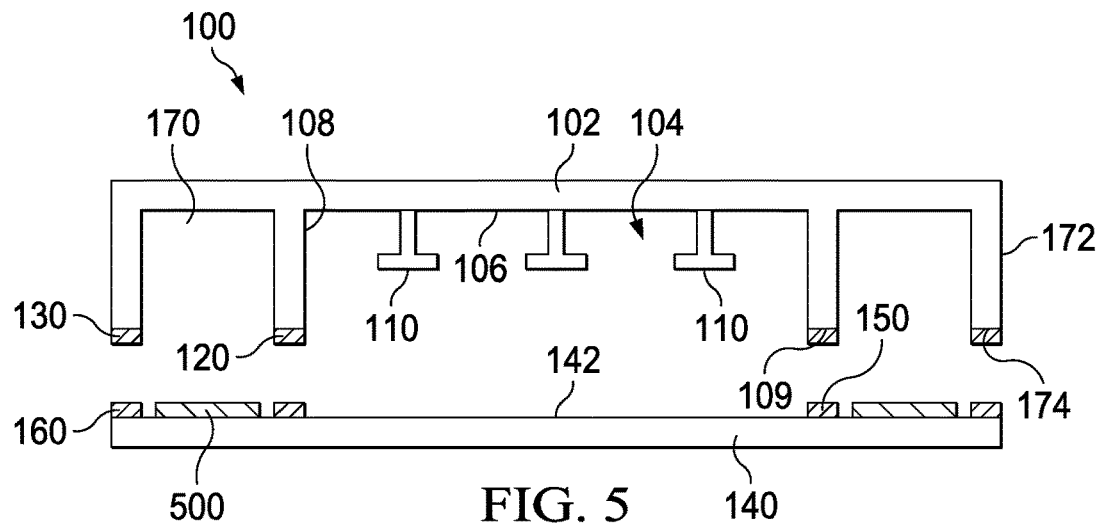
FIG. 5 is a partial cross-sectional view of another MEMS device before connecting together two substrates of the MEMS device.
Figure 6:
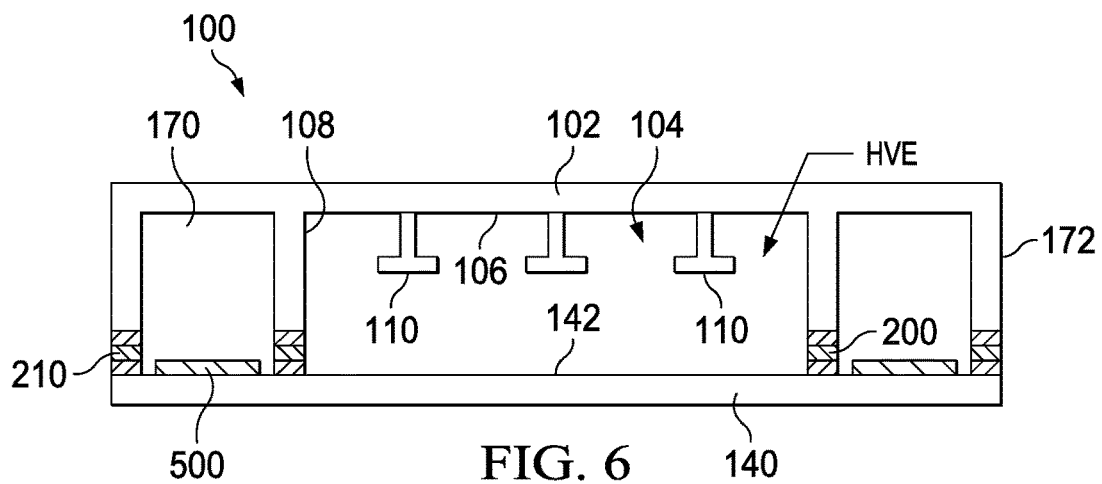
FIG. 6 is a partial cross-sectional view of the MEMS device of FIG. 5 after connecting together the two substrates of the MEMS device.

FIGS. 5-16 show additional examples of a MEMS device. The first and second substrates of the MEMS devices of FIGS. 5-16 have similar components, compositions and structures to the first and second substrates illustrated in FIGS. 1 and 2 and FIGS. 3 and 4 as previously described, and accordingly, the same reference numbers are used to identify the components of the MEMS device of FIGS. 5-16. One difference between the MEMS device of FIGS. 3 and 4 and the MEMS device of FIGS. 5 and 6 is that the getter agent 500 is deposited on the second substrate between the third and fourth metal layers 150, 160 instead of on the first substrate. The method for connecting the first and second substrates together in one example is the same as described with respect to FIGS. 3 and 4 and as set forth in FIG. 18.

As illustrated in FIGS. 5 and 6, the height of the getter agent is about the same as the height of metal layers 150, 160. In another example, the getter agent can be greater in height or less in height than the height of the metal layers 150, 160. The getter agent can be positioned fully or partially about metal layer 150. In one example, the getter agent is positioned fully about metal layer 150, and the composition and height of the getter agent is uniform about metal layer 150. The getter agent is illustrated as being applied on the top surface the second substrate. It can be appreciated that the top surface of the second substrate can be etched to form a channel in the top surface of the second substrate that is configured to receive the getter agent, however, this is optional. The composition of first and second substrates, the composition of getter agent, the function and effectiveness of the getter agent, the activation of the getter agent, the composition of the metal layers, and the composition and parameters of the metal bonds can be the same or similar to the MEMS devices described above with regard to FIGS. 1-4.

Figure 7:
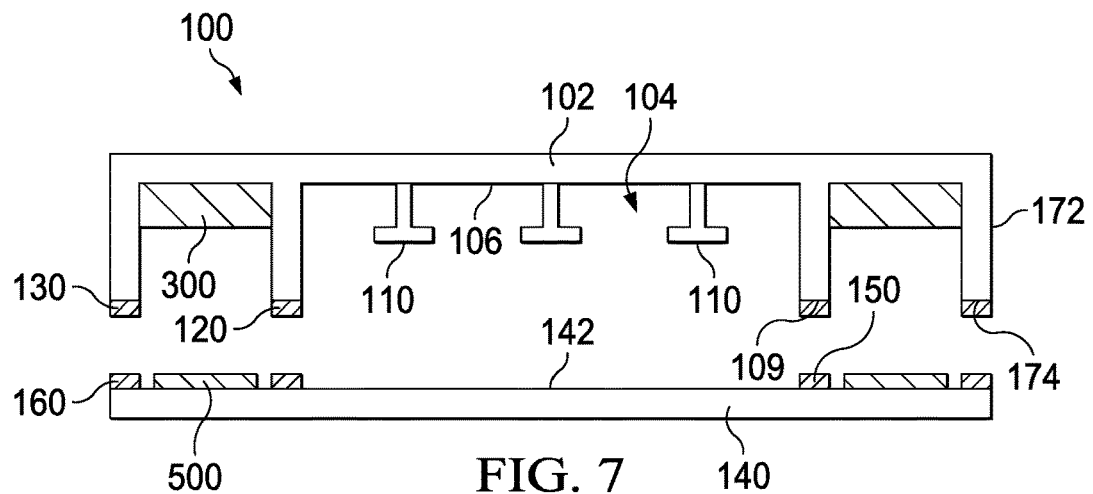
FIG. 7 is a partial cross-sectional view of another MEMS device before connecting together two substrates of the MEMS device.
Figure 8:
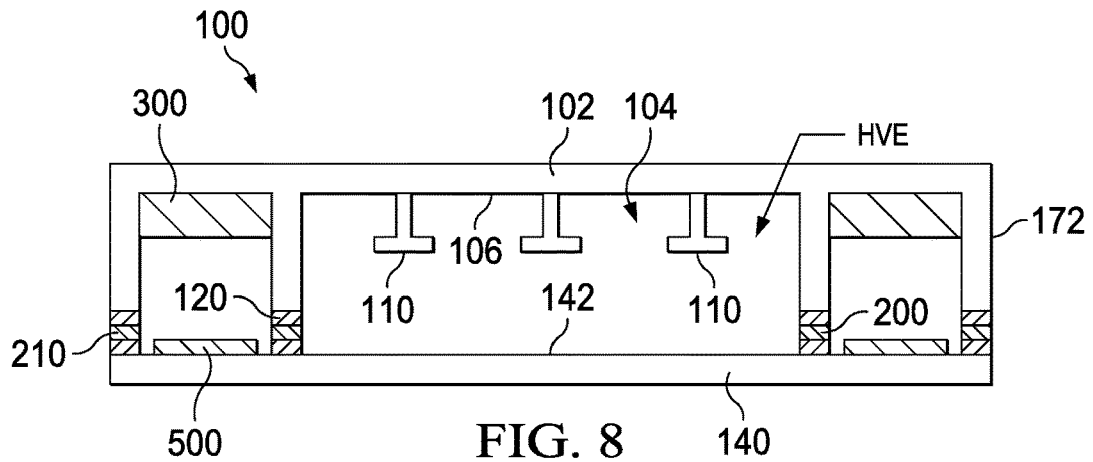
FIG. 8 is a partial cross-sectional view of the MEMS device of FIG. 7 after connecting together the two substrates of the MEMS device.

Referring now to the example illustrated in FIGS. 7 and 8, the difference between the MEMS device of FIGS. 5 and 6 and the MEMS device of FIGS. 7 and 8 is that getter agent 300 is deposited on the first substrate as illustrated in FIGS. 3 and 4 and also getter agent 500 is deposited on the second substrate between first and second metal layers 150, 160 as illustrated in FIGS. 5 and 6. The method for connecting the first and second substrates together is the same as described with respect to FIGS. 3 and 4 and as set forth in FIG. 18. The composition of first and second substrates, the composition of getter agent, the function and effectiveness of the getter agent, the activation of the getter agent, the composition of the metal layers, and the composition and parameters of the metal bonds can be the same or similar to the MEMS devices described above with regard to FIGS. 1-4.

Figure 9:
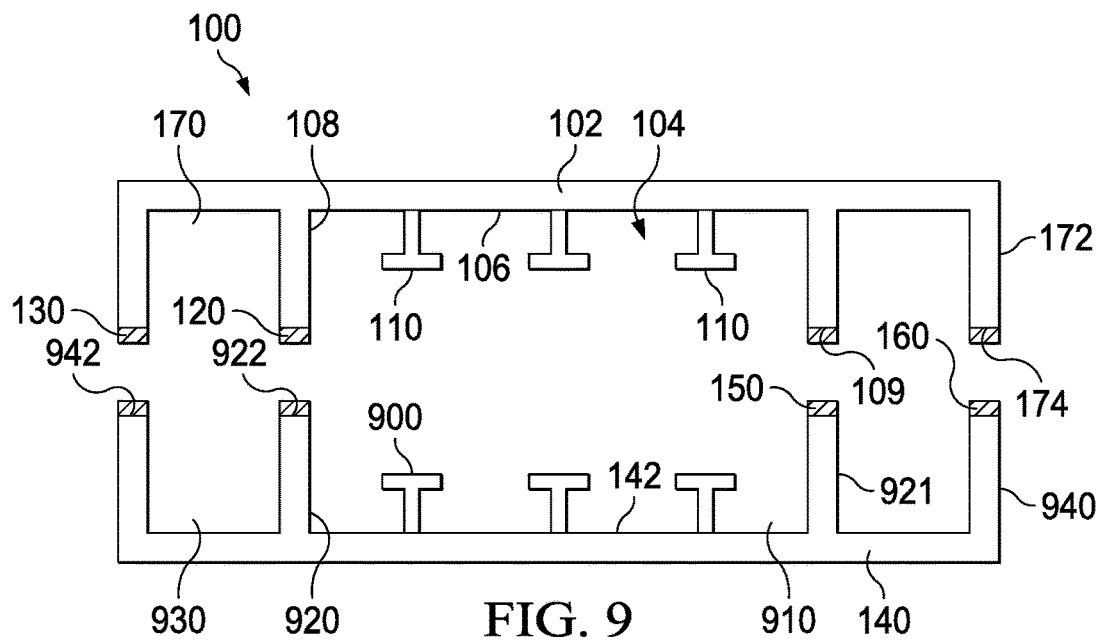
FIG. 9 is a partial cross-sectional view of another MEMS device before connecting together two substrates of the MEMS device.
Figure 10:
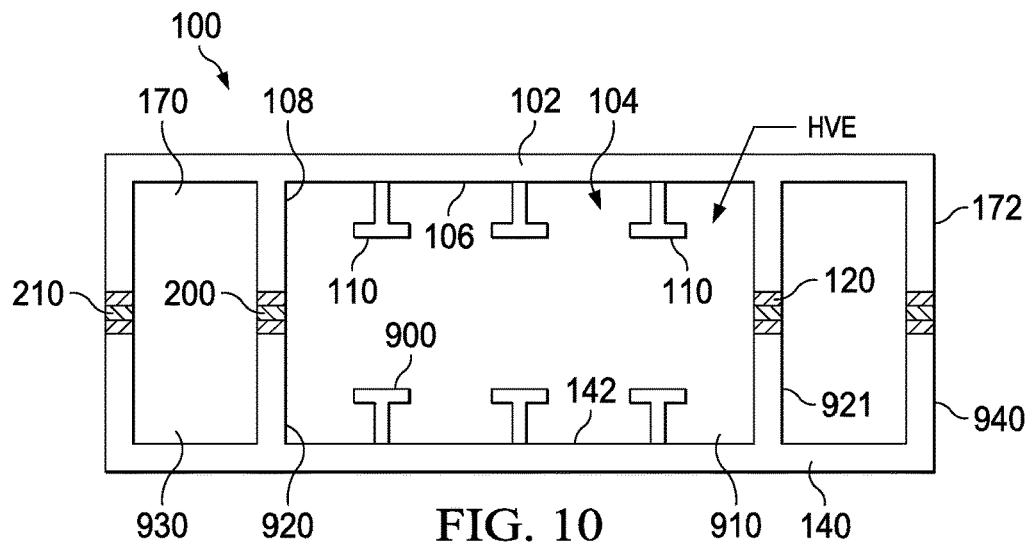
FIG. 10 is a partial cross-sectional view of the MEMS device of FIG. 9 after connecting together the two substrates of the MEMS device.

Referring now to the example illustrated in FIGS. 9 and 10, the difference between the MEMS device of FIGS. 1 and 2 and the MEMS device of FIGS. 9 and 10 is that 1) the second substrate includes a plurality of components 900 (e.g., MEMS components, etc.) located in second cavity 910, 2) first metal layer 150 is positioned partially or fully on the top surface 922 of first cavity wall 920, 3) a secondary cavity 930 is located between first cavity wall 920 and secondary wall 940, and 4) second metal layer 160 is positioned partially or fully on the top surface 942 of secondary wall 940. Components 900 can be formed on or attached or otherwise connected to the upper surface 142 of the second substrate. Components 110 and 900 can be the same or different. The number of components 110, 900 on the first and second substrates can be the same or different. The components 110, 900 on the first and second substrates can be any suitable size, shape, height configuration, type, and location. The method for connecting the first and second substrates together is the same as described with respect to FIGS. 1 and 2 and as set forth in FIG. 19. The composition of first and second substrates, and the composition and parameters of the metal bonds can be the same or similar to the MEMS devices described above with regard to FIGS. 1-2.

Figure 11:
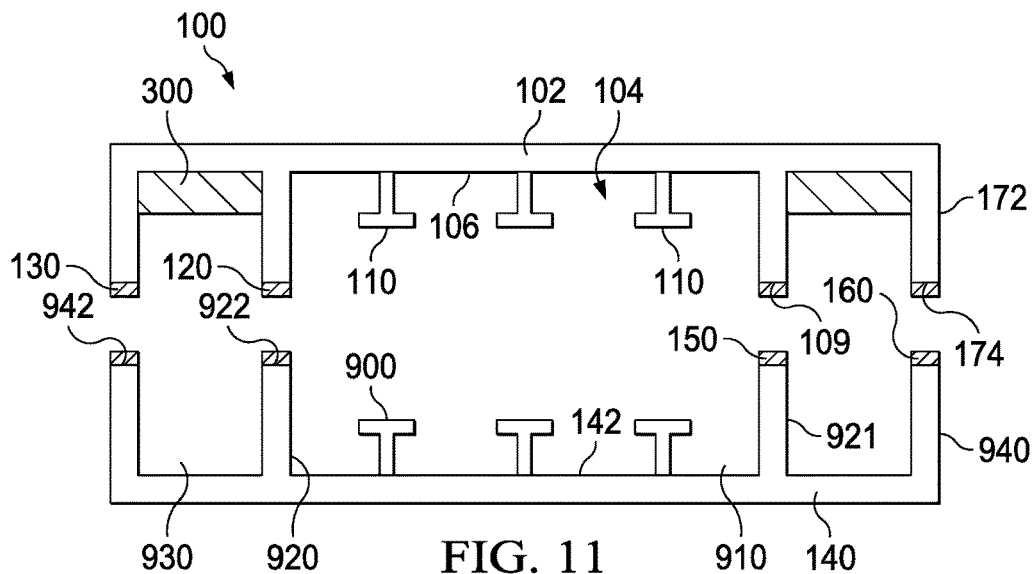
FIG. 11 is a partial cross-sectional view of another MEMS device before connecting together two substrates of the MEMS device.
Figure 12:
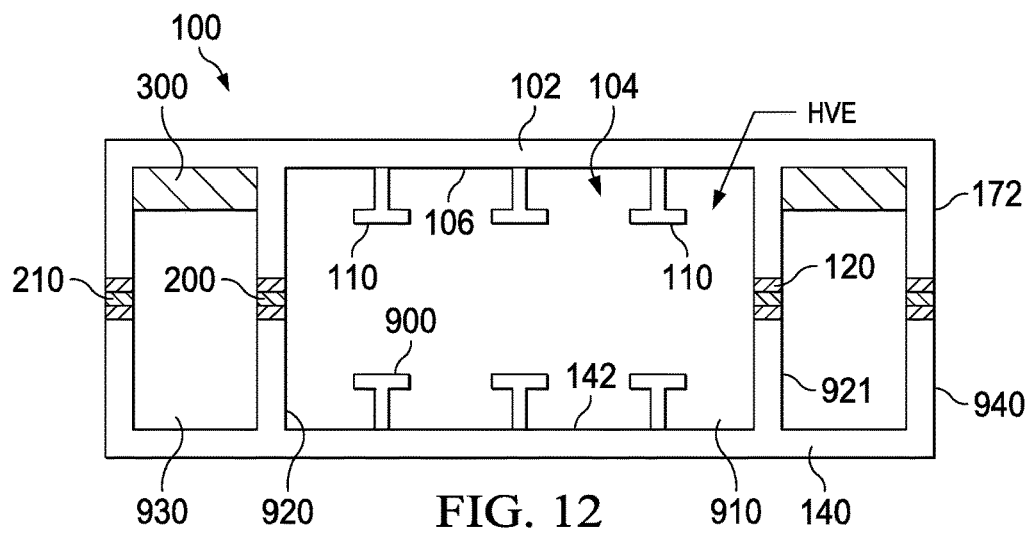
FIG. 12 is a partial cross-sectional view of the MEMS device of FIG. 11 after connecting together the two substrates of the MEMS device.

Referring now to the example illustrated in FIGS. 11 and 12, the difference between the MEMS device of FIGS. 9 and 10 and the MEMS device of FIGS. 11 and 12 is that getter agent 300 is deposited on the first substrate as illustrated in FIGS. 3 and 4. The method for connecting the first and second substrates together is the same as described with respect to FIGS. 3 and 4 and a set forth in FIG. 18. The composition of first and second substrates, the composition of getter agent, the function and effectiveness of the getter agent, the activation of the getter agent, the composition of the metal layers, and the composition and parameters of the metal bonds can be the same or similar to the MEMS devices described above with regard to FIGS. 1-4.

Figure 13:
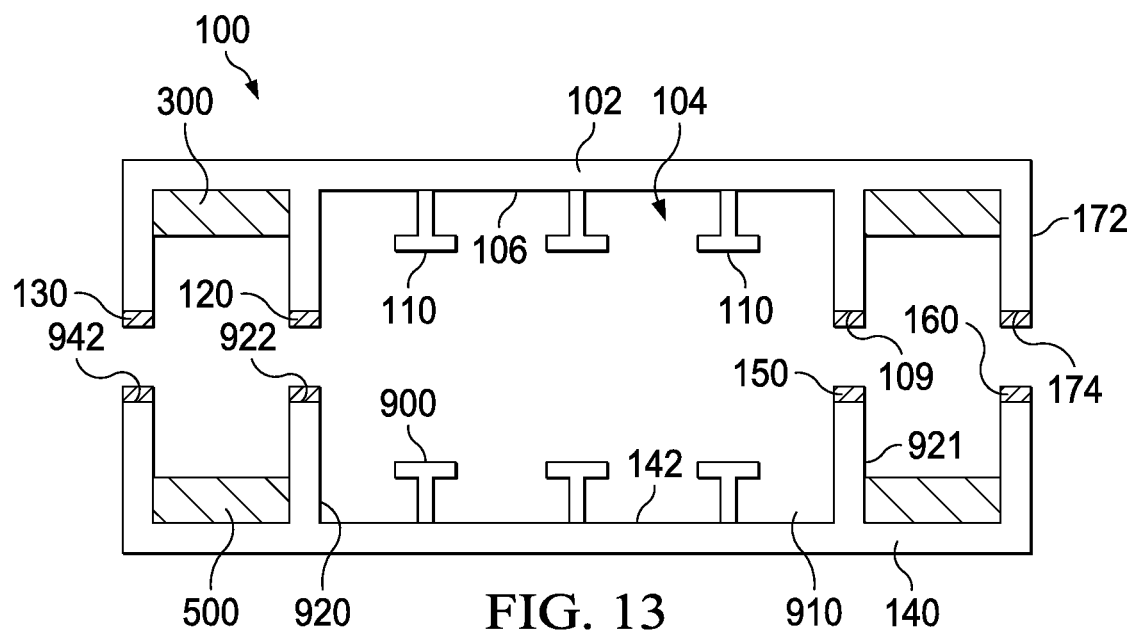
FIG. 13 is a partial cross-sectional view of another MEMS device before connecting together two substrates of the MEMS device.
Figure 14:
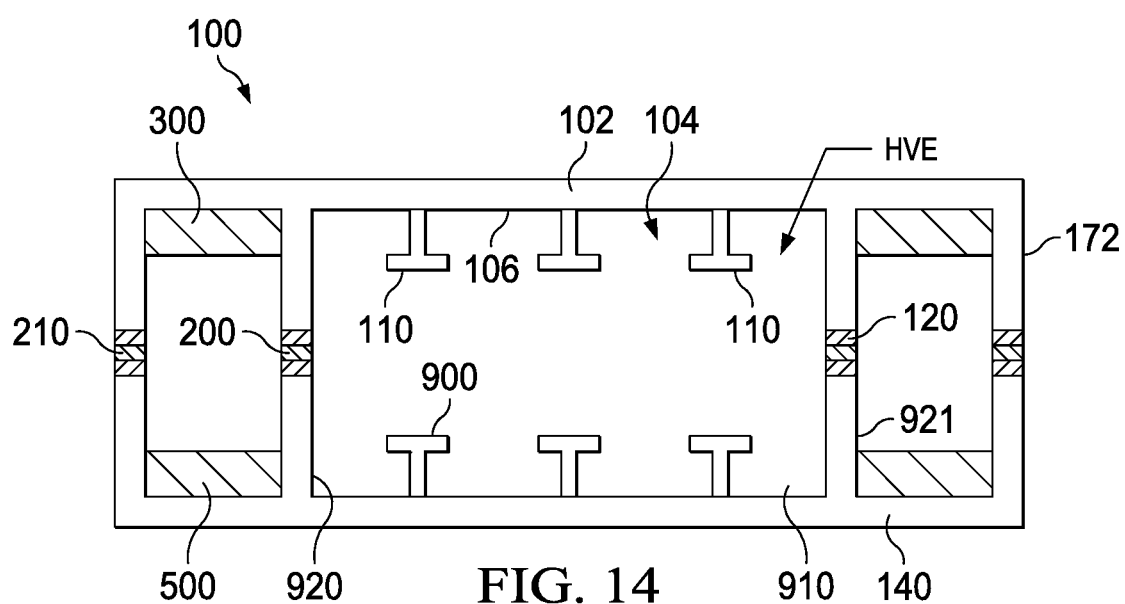
FIG. 14 is a partial cross-sectional view of the MEMS device of FIG. 13 after connecting together the two substrates of the MEMS device.

Referring now to the example illustrated in FIGS. 13 and 14, the difference between the MEMS device of FIGS. 11 and 12 and the MEMS device of FIGS. 13 and 14 is that getter agent 500 is deposited in secondary cavity 930 of the second substrate 140. The method for connecting the first and second substrates together is the same as described with respect to FIGS. 3 and 4 and a set forth in FIG. 18. As illustrated in FIGS. 13 and 14, the height of the getter agent is less than the height of first cavity wall 920 and secondary wall 940; however, it can be appreciated that the getter agent can have a height that is equal to or greater than the height of first cavity wall 920 and/or secondary wall 940. The getter agent can be positioned fully or partially about first cavity wall 920. In one example, the getter agent is positioned fully about first cavity wall 920, and the composition and height of the getter agent is uniform about first cavity wall 920. The composition of first and second substrates, the composition of getter agent, the function and effectiveness of the getter agent, the activation of the getter agent, the composition of the metal layers, and the composition and parameters of the metal bonds can be the same or similar to the MEMS devices described above with regard to FIGS. 1-4.

Figure 15:
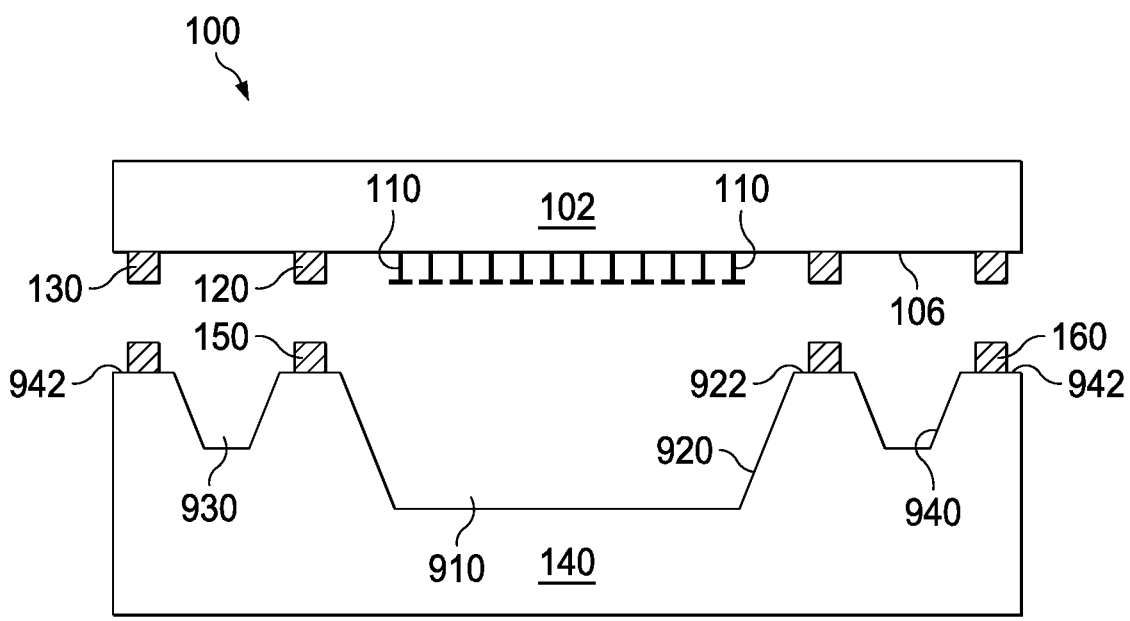
FIG. 15 is a partial cross-sectional view of another MEMS device before connecting together two substrates of the MEMS device.
Figure 16:
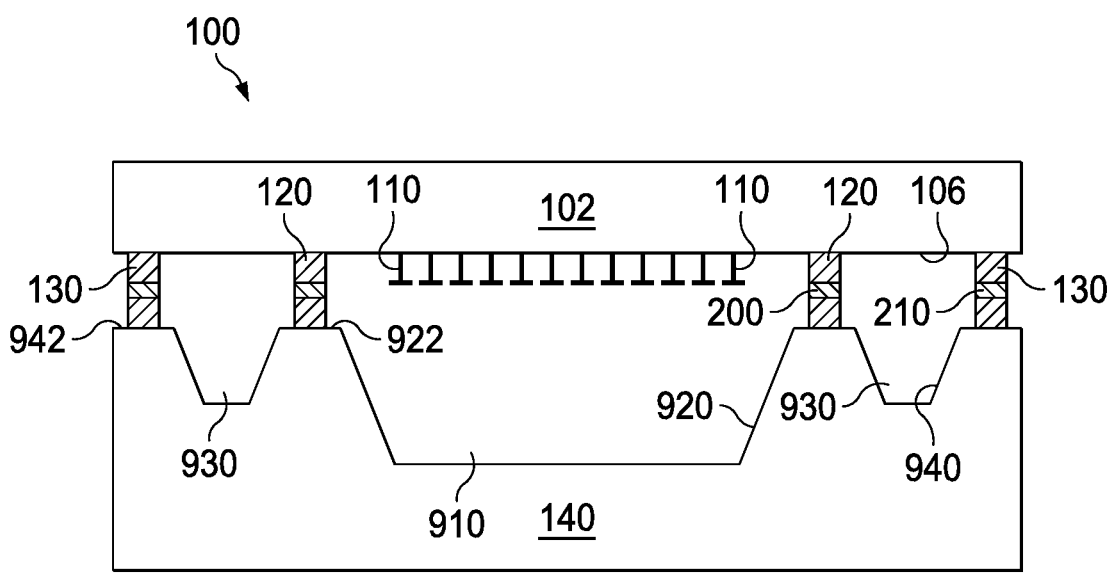
FIG. 16 is a partial cross-sectional view of the MEMS device of FIG. 13 after connecting together the two substrates of the MEMS device.

Referring now to the example illustrated in FIGS. 15 and 16, the difference between the MEMS device of FIGS. 9 and 10 and the MEMS device of FIGS. 15 and 16 is that 1) first substrate is absent first cavity 104, first cavity wall 108 and secondary wall 172, 2) the first and second metal layers 120, 130 are positioned on bottom surface 106 of the first substrate, 3) the walls of second cavity and secondary cavity 910, 930 are sloped, and 4) the depth of secondary cavity 930 is less than the depth of second cavity 910. The method for connecting the first and second substrates together is the same as described with respect to FIGS. 1 and 2 and as set forth in FIG. 19. The composition of first and second substrates, and the composition and parameters of the metal bonds can be the same or similar to the MEMS devices described above with regard to FIGS. 1-2. As can be appreciated, a getter agent can optionally be located between the first and second metal layers 120, 130 on the first substrate, and/or be located in secondary cavity 930 of the second substrate.

Modifications are possible in the described embodiments, and other embodiments are possible, within the scope of the claims.

What is claimed is:

1. A method of forming a device, the method comprising:
   in a first substrate having a first surface, forming a cavity in the first surface;
   forming a microelectromechanical system (MEMS) component in the cavity, comprising:

forming a first metal layer on or adjacent to a perimeter of the cavity;

forming a second metal layer on the first surface of the first substrate, the second metal layer being adjacent to the first metal layer;

on a second substrate having a second surface, forming a third metal layer and a fourth metal layer on the second surface, the fourth metal layer being spaced from the third metal layer;

placing the first and second substrates in a vacuum environment;

positioning the first and second substrates together, the first metal layer contacting or adjacent to the third metal layer, and the second metal layer contacting or adjacent to the fourth metal layer;

sealing the MEMS component in the cavity by heating the first, second, third and fourth metal layers to form a first metal bond between the first and third metal layers, and to form a second metal bond between the second and fourth metal layers; and adding a getter agent between the first metal layer and the second metal layer or between the third metal layer and the fourth metal layer before heating the first, second, third and fourth metal layers.

2. The method of claim 1, wherein the heating causes the getter agent to absorb water, or to bond with water vapor or other gasses from the cavity.

3. The method of claim 1, wherein the first, second, third, and fourth metal layers each comprise a metal selected from the group consisting of gold, indium, tin, gallium, copper, germanium, silicon, silver, platinum, palladium, nickel, and aluminum.

4. The method of claim 1, wherein the getter agent comprises a material selected from the group consisting of barium, aluminum, magnesium, calcium, sodium, strontium, cesium, phosphorus, zirconium, vanadium, cobalt, graphite, and zeolite.

5. The method of claim 1, wherein a thickness of the getter agent is 2-100 μm.

6. The method of claim 1, wherein a thickness of the first metal bond is 0.1-500 μm, and a thickness of the second metal bond is 0.1-500 μm.

7. The method of claim 1, wherein a bond width for each of the first, second, third, and fourth metal layers is 10-500 μm.

8. The method of claim 1, wherein a bond width for each of the first, second, third, and fourth metal layers is 10-500 μm.

9. The method of claim 1, wherein the heating causes the first, second, third, and fourth metal layers to heat to 150-600° C.

10. The method of claim 1, wherein the heating causes activation of the getter agent.

11. A device comprising:
a first substrate having a cavity on a first surface;
a component in the cavity;
a second substrate having a second surface;
a first metal bond extending around a perimeter of the cavity, the first metal bond forming coupling the first surface and the second surface to seal the component between the first and second substrates;
a second metal bond extending around a perimeter of the first metal bond, the second metal bond spaced from the first metal bond, the second metal bond coupling the first surface and the second surface; and
a getter agent between the first and second metal bonds.

12. The device of claim 11, wherein the first and second metal bonds each comprise a metal selected from the group consisting of gold, indium, tin, gallium, copper, germanium, silicon, silver, platinum, palladium, nickel, and aluminum.

13. The device of claim 11, wherein the getter agent comprise a material selected from the group of barium, aluminum, magnesium, calcium, sodium, strontium, cesium, phosphorus, zirconium, vanadium, cobalt, graphite, and zeolite.

14. The device of claim 11, wherein a thickness of the getter agent is 2-100 μm.

15. The device of claim 11, wherein a thickness the first metal bond is 0.1-500 μm, and a thickness the second metal bond is 0.1-500 μm.

16. The device of claim 11, wherein a bond width for each of the first and the second metal bonds is 10-500 μm.

17. The device of claim 11, wherein the first and second substrates comprise the same material.

18. The device of claim 11, wherein the first and second substrates are formed of different materials.

19. The device of claim 11, wherein the first and second substrates comprise a material selected from the group consisting of glass, metal, ceramic, silicon, silicon-germanium, and gallium arsenide.

20. The device of claim 11, wherein one of the first and second substrates is a semiconductor substrate.

21. The device of claim 11, wherein the component is a microelectromechanical system (MEMS) component.

22. The device of claim 11, wherein the component is on the first substrate.

23. A device comprising:
a first substrate having a cavity on a first surface of the first substrate;
a microelectromechanical system (MEMS) component on the first substrate in the cavity;
a second substrate having a second surface;
a first metal bond extending around a perimeter of the cavity, the first metal bond coupling the first surface and the second surface;
a second metal bond extending around a perimeter of the first metal bond, the second metal bond spaced from the first metal bond, the second metal bond coupling the first surface and the second surface; and
a getter agent between the first and second metal bonds.

* * * * *